United States Patent [19]

Chen

[11] Patent Number: 5,976,949
[45] Date of Patent: Nov. 2, 1999

[54] METHOD FOR FORMING SHALLOW TRENCH ISOLATION

[75] Inventor: Hengtien Henry Chen, Taipei, Taiwan

[73] Assignee: Winbond Electronics Corp., Taiwan

[21] Appl. No.: 08/863,577

[22] Filed: May 27, 1997

[30] Foreign Application Priority Data

Mar. 4, 1997 [TW] Taiwan .................................. 86102609

[51] Int. Cl.⁶ .................................................. H01L 21/76
[52] U.S. Cl. .......................................... 438/427; 438/435
[58] Field of Search ................................... 438/248, 259, 438/412, 424, 427, 435, 437, 444

[56] References Cited

U.S. PATENT DOCUMENTS

| | | | |
|---|---|---|---|
| 4,385,975 | 5/1983 | Chu et al. ................................. | 438/435 |
| 4,615,103 | 10/1986 | Kameyama et al. ..................... | 438/430 |
| 4,671,970 | 6/1987 | Keiser et al. ............................. | 438/427 |
| 5,362,669 | 11/1994 | Boyd et al. ............................... | 438/427 |
| 5,665,635 | 9/1997 | Kwon et al. ............................. | 438/427 |
| 5,702,977 | 12/1997 | Jang et al. ................................ | 438/427 |
| 5,804,490 | 9/1998 | Fiegl et al. ............................... | 438/430 |
| 5,872,043 | 2/1999 | Chen ......................................... | 438/424 |

*Primary Examiner*—Olik Chaudhuri
*Assistant Examiner*—Anh Duy Mai
*Attorney, Agent, or Firm*—Finnegan, Henderson, Farabow, Garrett & Dunner, L.L.P.

[57] ABSTRACT

A method for forming shallow trench isolation that can avoid dishing effect produced by a conventional manufacturing process. The method utilizes photolithographic and etching techniques to define a dummy pattern inside a shallow trenches having a deposited dielectric layer, and then through the deposition of a second dielectric layer, followed by a planarization using a chemical-mechanical polishing method, a shallow trench isolation having a good planar surface is obtained.

16 Claims, 3 Drawing Sheets

METHOD FOR FORMING SHALLOW TRENCH ISOLATION

BACKGROUND OF THE INVENTION

1. Field of Invention

This invention relates in general to a semiconductor isolation method, and more particularly to a method for forming a shallow trench isolation.

2. Description of Related Art

To prevent short circuiting and unnecessary operational interference between transistors in the manufacturing of semiconductors, it is often necessary to isolate every single transistor. As the level of integration in integrated circuits has become higher and higher, for example, a hundred thousand of more transistors can easily be packed inside 1~2 cm² of silicon surface area in more advanced VLSI manufacturing processes, a conventional isolation method such as local oxidation method (LOCOS) has become inadequate. LOCOS is now gradually being replaced by shallow trench isolation methods, which require less space for the isolation regions and hence are capable of increasing the level of component integration. The shallow trench method includes literally "digging" a trench in areas between two transistors by an anisotropic dry etching method and then refilling the trench with insulating material such as silicon dioxide to achieve an effective isolation.

A conventional method for forming a shallow trench isolation is to form sequentially a pad oxide layer and a silicon nitride layer above a semiconductor substrate, then using photolithographic and etching techniques to define a window in the location designed for the formation of a shallow trench isolation region. Next, using the silicon nitride layer as a mask, the substrate surface exposed through the window is etched to form a shallow trench for the necessary isolation. Details of the manufacturing steps are shown in FIGS. 1A through 1D.

First, referring to FIG. 1A, a pad oxide layer 102 with a thickness of about 20 nm and a polishing barrier stop layer 104, such as silicon nitride, with a thickness of about 200 nm are formed sequentially above a semiconductor substrate 100. Next, photolithographic processes are used to define a photoresist layer 106. With the photoresist layer 106 in place, the polishing barrier stop layer 104, the pad oxide layer 102 and the semiconductor substrate 100 are etched sequentially to form at least one narrow trench 101 and at least one wide trench 103 having a width, for example, slightly bigger than about 3 μm. The depth of the trenches below the surface of the semiconductor substrate 100 is about 400 nm.

Referring next to FIG. 1B, after the removal of photoresist layer 106, a liner oxide layer (not shown in the Figure) is formed on the exposed substrate surface of trenches 101 and 103 by a thermal oxidation method. Then, a dielectric layer 108 is deposited to refill the narrow trenches 101 and the wide trench 103 as in FIG. 1A, for example, by a semi-atmospheric chemical vapor deposition (SACVD) method using tetra-ethyl-ortho-silicate (TEOS)/Ozone (O₃) as the main reactive gases to deposit a silicon dioxide layer. However, a slightly caved-in region 105 is created on the upper surface of the dielectric layer 108 above the wide trench 103. The step height of the caved-in region 105 can be comparable to the depth of the trenches itself Referring next to FIG. 1C, planarization is subsequently performed using a chemical-mechanical polishing (CMP) method to remove part of the dielectric layer 108 and part of the polishing barrier stop layer 104. However, due to the effects of a pattern density variation in the wafer as well as the aforementioned caved-in region 105 on the upper surface above the wide trenches, the polishing rate for each region is going to be different. Generally, for regions having less polishing barrier stop such as 108b, overpolishing will result, forming a slightly concave surface 107 known as dishing.

Lastly, referring to Figure ID, the residual polishing barrier stop layer 104 and the pad oxide layer 102 are removed, thus finishing the formation of the shallow trench isolation regions. Yet, problems generated by the dishing effect still remain. Since the upper surface of the wide trenches slightly sags in the middle, out of focus problems will arise in subsequent photolithographic operations, and as a result, subsequent etching for the manufacturing of the gate terminals will be affected.

SUMMARY OF THE INVENTION

It is therefore an object of this invention to provide a method for forming shallow trench isolation that can eliminate the problems caused by dishing in a conventional manufacturing process.

To achieve the object stated above, a method for forming shallow trench isolation regions consistent with the present invention is provided, which includes the steps of:

forming a pad oxide layer and a first polishing barrier stop layer in sequence above a substrate;

defining the first polishing barrier stop layer, the pad oxide layer, and the substrate to form at least one narrow trench and at least one wide trench;

depositing a first dielectric layer to refill the narrow trenches and the wide trenches such that a thickness of the first dielectric layer is approximately equal to the depth of the trenches;

forming at least a second polishing barrier stop layer over the first dielectric layer above the wide trenches;

defining the second polishing barrier stop layer and the first dielectric layer to form a dummy pattern having a planar second polishing barrier stop layer surface on top;

depositing a second dielectric layer to refill the narrow trenches and the wide trenches;

using chemical-mechanical polishing method to remove part of the second dielectric layer, part of the first polishing barrier stop layer, and part of the second polishing barrier stop layer to form a planarized surface; and removing the first polishing barrier stop layer, the second polishing barrier stop layer, and the pad oxide layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
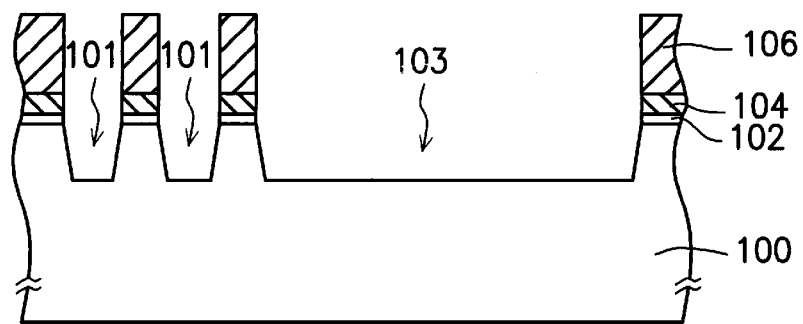
FIGS. 1A through 1D are cross-sectional views showing a shallow trench isolation formed by a conventional manufacturing process.
Figure 1B:
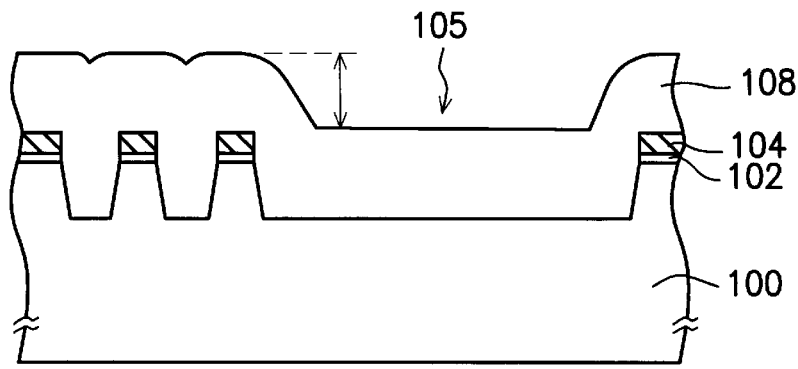
Figure 1C:
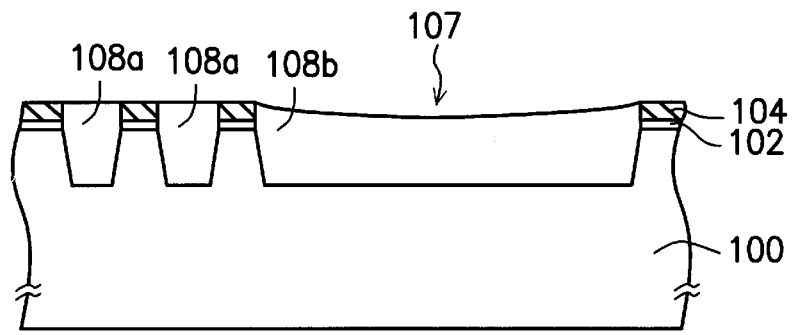
Figure 1D:
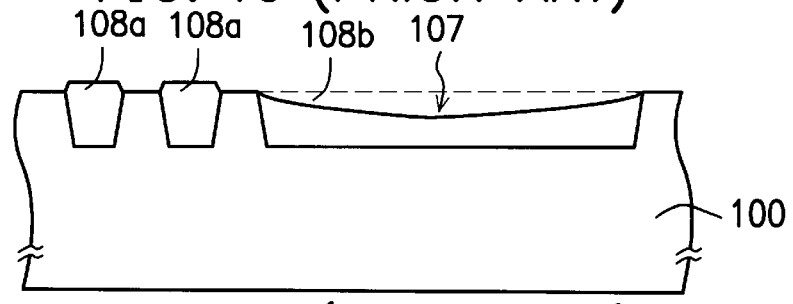
Figure 2A:
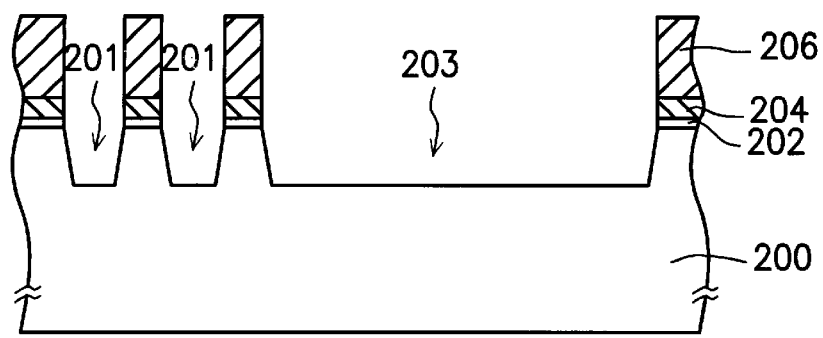
FIGS. 2A through 2G are cross-sectional views showing the manufacturing flow of a shallow trench isolation consistent with the present invention.

First, referring to FIG. 2A, a pad oxide layer 202 with thickness of about 20 nm is formed above a semiconductor substrate 200, for example, using a thermal oxidation method. A first polishing barrier stop layer 204 is deposited above the pad oxide layer 202, for example, using a low pressure chemical vapor deposition method to deposit a silicon nitride layer with a thickness of about 200 nm. Next, a photolithographic technique is used to define a pattern on a photoresist layer 206 formed on the first polishing barrier stop layer 204. Then, the first polishing barrier stop layer 204, the pad oxide layer 202, and the semiconductor substrate 200 are etched to form at least one narrow trench 201 and at least one wide trench 203 in the semiconductor substrate 200. The width of the wide trench 203, for example, is approximately greater than 3 um, and the depth of the trenches below the surface of the semiconductor substrate 200 is approximately 400 nm.

Figure 2B:
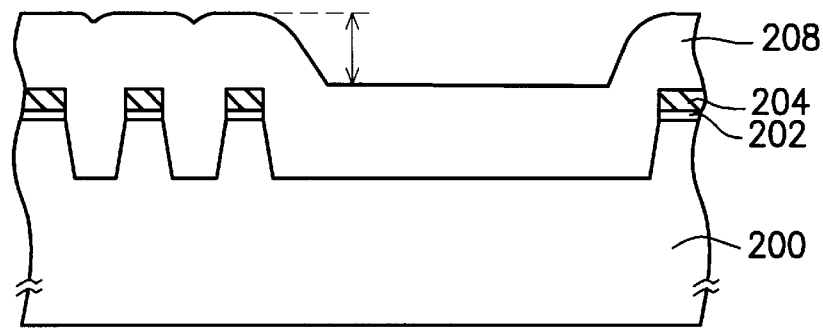

Referring next to FIG. 2B, after the removal of the photoresist layer 206, a first liner oxide layer (not shown in the Figure) is formed on the exposed substrate surface of trenches 201 and 203. Then, a first dielectric layer 208 is deposited refilling the narrow trenches 201 and the wide trench 203 with its thickness approximately equal to the depth of the trenches, that is, a thickness of about 400 nm. The dielectric layer 208 is, for example, a silicon dioxide layer deposited by a semi-atmospheric chemical vapor deposition (SACVD) method using TEOS/O$_3$ as the main reactive gases.

Figure 2C:
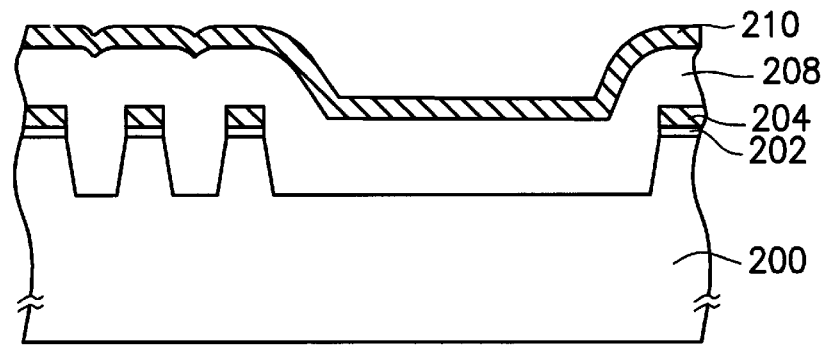

Referring next to FIG. 2C, at least a second polishing barrier stop layer 210 is formed over the first dielectric layer 208 above the wide trench 203, for example, using a low pressure chemical vapor deposition method to deposit a silicon nitride layer with a thickness of about 200 nm.

Figure 2D:
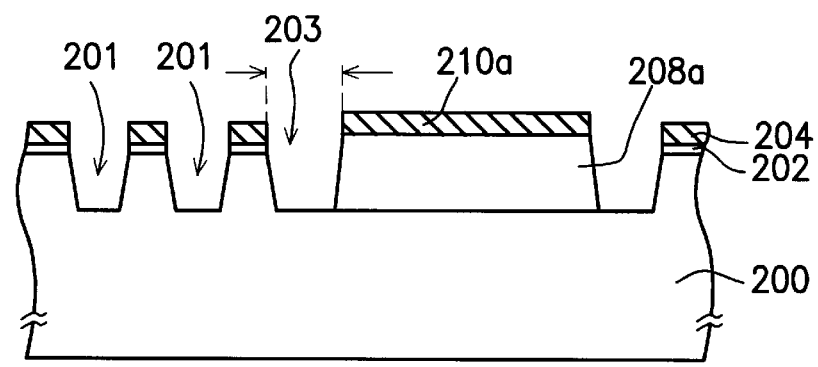

Referring next to FIG. 2D, the second polishing barrier stop layer 210 and the first dielectric layer 208 are defined to form a dummy pattern including a second polishing barrier stop layer 210a with a planarized surface and a first dielectric layer 208a below. The dummy pattern acts as a polishing barrier plate in subsequent CMP operations for the wide trench, thus preventing the formation of a curved dish there. The distance from the dummy pattern to each side of the wide trench 203 is about 0.5 um.

Figure 2E:
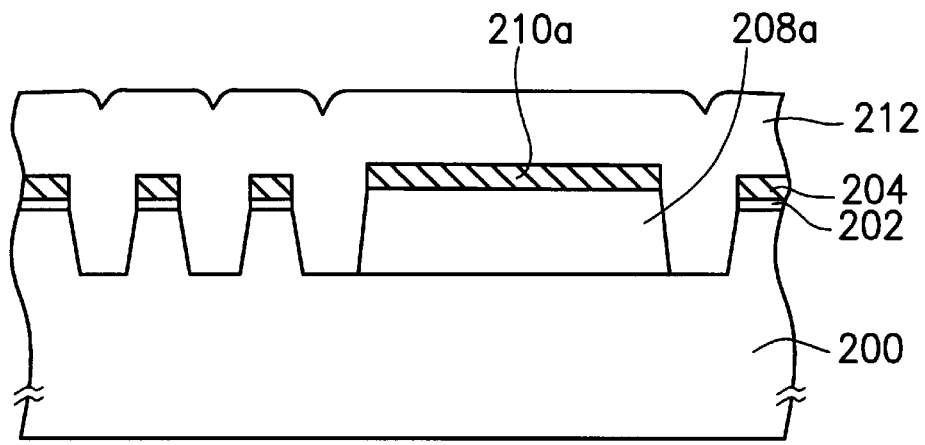

Referring next to FIG. 2E, a second liner oxide layer (not shown in the Figure) is again formed on the exposed surface of the trenched 201 and 203. Then, a second dielectric layer 212 with a thickness of about 600 nm is deposited, refilling the narrow trenches 201 and the wide trench 203. Owing to the presence of a dummy plate, there is only a small topographical surface variation in the second dielectric layer 212 after its formation as shown in FIG. 2E.

Figure 2F:
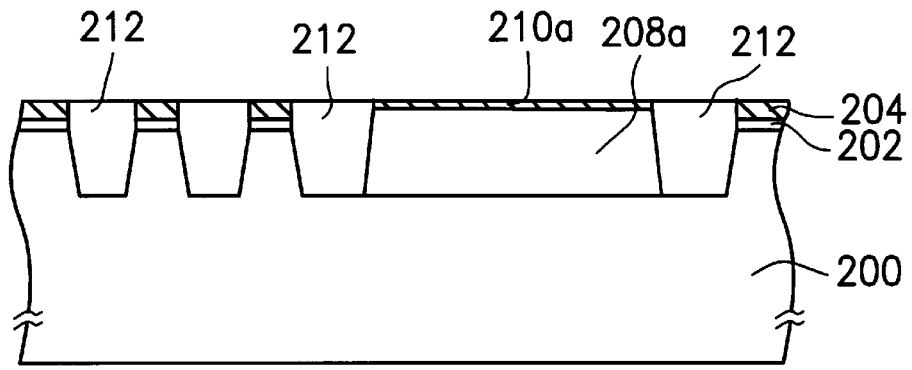

Referring next to FIG. 2F, a CMP method is again used to remove part of the second dielectric layer 212, part of the first polishing barrier stop layer 204, and part of the second polishing barrier stop layer 210a to form a planarized surface. Since topographical surface variation of the second dielectric layer 212 is small, and furthermore, the wide trench is covered by a second polishing barrier stop layer 210a, a planarized surface without any dishing is obtained after the polishing operation.

Figure 2G:
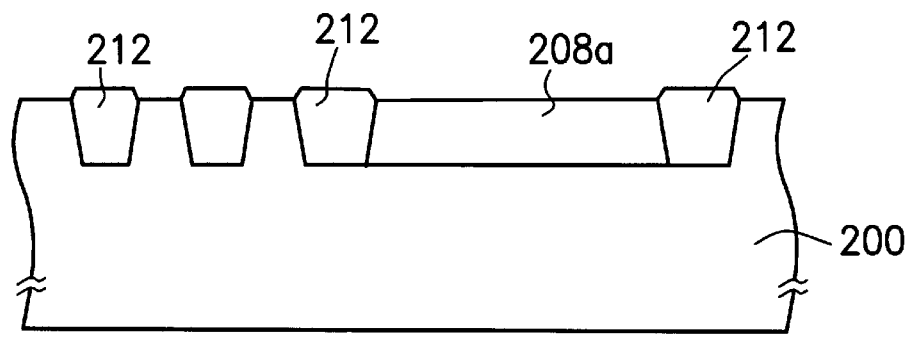

Lastly, referring to FIG. 2G, after the removal of the residual second polishing barrier stop layer 210a, the planarized first dielectric layer 208a below is exposed. And after the removal of the residual first polishing barrier stop layer 204 and the pad oxide layer 202, the shallow trench isolation is complete.

The method for forming shallow trench isolation according to the invention described above can prevent dishing due to the following reasons:

(1) A good planarity for the wafer surface before the performance of a CMP operation:

Since the polishing amount is directly proportional to the surface undulation, a smaller topographical surface variation lowers the necessary polishing amount.

(2) A polishing barrier stop layer above the wide trenches:

The polishing barrier stop layer made from silicon nitride protects against the overpolishing of the dielectric layer above the wide trench during CMP operation, thus avoiding any dishing.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for forming shallow trench isolation comprising the steps of:

defining a substrate to form at least one narrow trench and at least one wide trench;

depositing a first dielectric layer to refill the narrow trenches and the wide trenches, the first dielectric layer having a thickness approximately equal to the depth of the wide trenches;

forming at least a first polishing barrier stop layer over the first dielectric layer above the wide trenches;

defining the first polishing barrier stop layer and the first dielectric layer to form a dummy pattern in the wide trenches, the dummy pattern having a planarized first polishing barrier stop layer surface;

depositing a second dielectric layer covering the substrate;

using a chemical-mechanical polishing method to remove part of the second dielectric layer and part of the first polishing barrier stop layer to form a planarized surface; and removing the first polishing barrier stop layer.

2. A method according to claim 1, wherein the step of defining a substrate includes the substep of
forming a pad oxide layer and a second polishing layer on the substrate before forming the narrow trenches and the wide trenches, the step of using a chemical-mechanical polishing method includes the substep of
removing part of the second polishing barrier stop layer, and the step of removing the first polishing barrier stop layer includes the substep of
removing the second polishing barrier stop layer and the pad oxide layer.

3. A method according to claim 2, wherein the thickness of the pad oxide layer is about 20 nm and is formed by a thermal oxidation method.

4. A method according to claim 2, wherein the second polishing barrier stop layer is a silicon nitride layer.

5. A method according to claim 2, wherein the thickness of the second polishing barrier stop layer is about 200 nm and is formed by a low pressure chemical vapor deposition method.

6. A method according to claim 1, wherein the depth of the narrow trenches and the wide trenches is about 400 nm.

7. A method according to claim 1, wherein the width of the wide trenches is approximately bigger than 3 um.

8. A method according to claim 1, further comprising the step of:

forming a first liner oxide layer on the exposed substrate surface of the trenches by a thermal oxidation method after the step of defining a substrate.

9. A method according to claim 1, wherein the first dielectric layer is formed by a semi-atmospheric chemical vapor deposition method using tetra-ethyl-ortho-silicate/ozone as the reactive gases.

10. A method according to claim 1, wherein the thickness of the first dielectric layer is about 500 nm.

11. A method according to claim 1, wherein the first polishing barrier stop layer is a silicon nitride layer.

12. A method according to claim 1, wherein the thickness of the first polishing barrier stop layer is about 200 nm and is formed by a low pressure chemical vapor deposition method.

13. A method according to claim 1, wherein in the step of defining the first polishing barrier stop layer and the first dielectric layer, the distance from the first polishing barrier stop layer to each side of the wide trench after definition is about 0.5 um.

14. A method according to claim 1, wherein the thickness of the second dielectric layer is about 600 nm.

15. A method for forming shallow trench isolation comprising the steps of:

defining a substrate to form at least one narrow trench and at least one wide trench;

depositing a first dielectric layer to refill the narrow trenches and the wide trenches, the first dielectric layer having a thickness approximately equal to the depth of the wide trenches;

forming at least a first polishing barrier stop layer over the first dielectric layer above the wide trenches;

defining the first polishing barrier stop layer and the first dielectric layer to form a dummy pattern in the wide trenches, the dummy pattern having a planarized first polishing barrier stop layer surface;

forming a second liner oxide layer on the exposed substrate surface of the trenches by a thermal oxidation method after the step of defining the first polishing barrier stop layer and the first dielectric layer;

deposing a second dielectric layer covering the substrate;

using a chemical-mechanical polishing method to remove part of the second dielectric layer and part of the first polishing barrier stop layer to form a planarized surface; and removing the first polishing barrier stop layer.

16. A method for forming shallow trench isolation comprising the steps of:

preparing a substrate having at least one narrow trench and at least one wide trench therein;

defining a substrate to form at least one narrow trench and at least one wide trench;

forming a first dielectric layer to refill the narrow trenches and the wide trenches, the first dielectric layer having a thickness approximately equal to the depth of the wide trenches;

forming at least a first polishing barrier stop layer over the first dielectric layer above the wide trenches;

patterning the first polishing barrier stop layer and the first dielectric layer to form a dummy pattern in the wide trenches, the dummy pattern having a planarized first polishing barrier stop layer surface;

forming a second dielectric layer covering the substrate;

using a chemical-mechanical polishing method to remove part of the second dielectric layer and part of the first polishing barrier stop layer to form a planarized surface; and removing the first polishing barrier stop layer.

* * * * *